United States Patent
Ouchi et al.

(10) Patent No.: US 8,759,691 B2
(45) Date of Patent: Jun. 24, 2014

(54) WIRING BOARD AND METHOD FOR MANUFACTURING THE SAME

(75) Inventors: Shinji Ouchi, Ogaki (JP); Shigeru Yamada, Ogaki (JP); Makoto Terui, Ogaki (JP); Yoshinori Shizuno, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 300 days.

(21) Appl. No.: 13/174,837

(22) Filed: Jul. 1, 2011

(65) Prior Publication Data

US 2012/0008295 A1 Jan. 12, 2012

Related U.S. Application Data

(60) Provisional application No. 61/363,015, filed on Jul. 9, 2010.

(51) Int. Cl.
*H05K 1/11* (2006.01)

(52) U.S. Cl.
USPC ........... 174/262; 174/250; 174/255; 174/257; 174/258; 174/261; 174/263; 174/264; 174/265; 174/266; 257/698; 438/639; 438/640; 361/783

(58) Field of Classification Search
USPC ................. 174/250, 255, 257, 258, 261–266; 257/698; 438/639, 640; 361/783
See application file for complete search history.

(56) References Cited

U.S. PATENT DOCUMENTS

| | | | | |
|---|---|---|---|---|
| 5,764,119 A | * | 6/1998 | Miyagi et al. | 333/238 |
| 6,010,769 A | * | 1/2000 | Sasaoka et al. | 428/209 |
| 6,312,791 B1 | * | 11/2001 | Fasano et al. | 428/210 |
| 7,211,899 B2 | * | 5/2007 | Taniguchi et al. | 257/774 |
| 7,312,400 B2 | * | 12/2007 | Ito et al. | 174/250 |
| 7,678,695 B2 | * | 3/2010 | Taniguchi et al. | 438/667 |
| 2002/0046880 A1 | * | 4/2002 | Takubo et al. | 174/261 |
| 2007/0155174 A1 | * | 7/2007 | Taniguchi et al. | 438/667 |
| 2008/0257591 A1 | * | 10/2008 | Ikeda | 174/255 |
| 2009/0242261 A1 | * | 10/2009 | Takenaka et al. | 174/262 |
| 2010/0065318 A1 | * | 3/2010 | Nagasawa et al. | 174/260 |

FOREIGN PATENT DOCUMENTS

| | | |
|---|---|---|
| JP | 2002-064161 | 2/2002 |
| JP | 2002064162 A * | 2/2002 ............. H01L 23/12 |

OTHER PUBLICATIONS

U.S. Appl. No. 13/174,811, filed Jul. 1, 2011, Ouchi, et al.

* cited by examiner

*Primary Examiner* — Hung S Bui
*Assistant Examiner* — James Wu
(74) *Attorney, Agent, or Firm* — Oblon, Spivak, McClelland, Maier & Neustadt, L.L.P.

(57) ABSTRACT

A wiring board has a first resin insulation layer, a first conductive pattern formed on the first resin insulation layer, a second resin insulation layer formed on the first conductive pattern and having an opening portion exposing at least a portion of the first conductive pattern, a second conductive pattern formed on the second resin insulation layer, and a via conductor formed in the opening portion of the second resin insulation layer and electrically connecting the first conductive pattern and the second conductive pattern. The via conductor has a side surface extending between the first conductive pattern and the second conductive pattern and a bent portion where an inclination of the side surface of the via conductor changes in a depth direction of the via conductor.

17 Claims, 14 Drawing Sheets

| Connection Conductor | Durability Test Result (MPa) |
|---|---|
| Embodiment (FIG. 3) | 342 |
| Comparative Example 1 (FIG. 5A) | 566 |
| Comparative Example 2 (FIG. 5B) | 339 |

FIG.6

WIRING BOARD AND METHOD FOR MANUFACTURING THE SAME

CROSS-REFERENCE TO RELATED APPLICATIONS

The present application claims the benefits of priority to U.S. Application No. 61/363,015, filed Jul. 9, 2010. The contents of that application are incorporated herein by reference in their entirety.

BACKGROUND OF THE INVENTION

1. Field of the Invention

The present invention relates to a wiring board and its manufacturing method.

2. Discussion of the Background

In Japanese Laid-Open Patent Publication No. 2002-64161, a semiconductor device having a semiconductor chip and a wiring board is described. The semiconductor device described in Japanese Laid-Open Patent Publication No. 2002-64161 has the above semiconductor chip, an insulation layer formed on the semiconductor chip, and a conductor (via conductor) filled in a via hole formed in the insulation layer. The via conductor is the electrical passage from an electrode pad of the semiconductor chip through an outermost layer. The contents of Japanese Laid-Open Patent Publication No. 2002-64161 are incorporated herein by reference in their entirety in the present application.

SUMMARY OF THE INVENTION

According to one aspect of the present invention, a wiring board includes a first resin insulation layer, a first conductive pattern formed on the first resin insulation layer, a second resin insulation layer formed on the first conductive pattern and having an opening portion exposing at least a portion of the first conductive pattern, a second conductive pattern formed on the second resin insulation layer, and a via conductor formed in the opening portion of the second resin insulation layer and electrically connecting the first conductive pattern and the second conductive pattern. The via conductor has a side surface extending between the first conductive pattern and the second conductive pattern and a bent portion where an inclination of the side surface of the via conductor changes in a depth direction of the via conductor.

According to another aspect of the present invention, a method for manufacturing a wiring board includes forming a first resin insulation layer on a support body, forming a first conductive pattern on the first resin insulation layer, forming a second resin insulation layer on the first conductive pattern and the first resin insulation layer, forming in the second resin insulation layer an opening portion exposing at least a portion of the first conductive pattern such that the opening portion has a side wall extending to the portion of the first conductive pattern and a bent portion where an inclination of the side wall of the opening portion changes in a depth direction of the opening portion, forming in the opening portion of the second resin insulation layer a via conductor extending to the first conductive pattern such that the via conductor has a side surface extending to the first conductive pattern and a bent portion where an inclination of the side surface of the via conductor changes in a depth direction of the via conductor, and forming a second conductive pattern on the second resin insulation layer such that the second conductive pattern is electrically connected to the first conductive pattern via the via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a table showing simulation results of durability testing carried out on each via conductor;

DETAILED DESCRIPTION OF THE EMBODIMENTS

Figure 1:
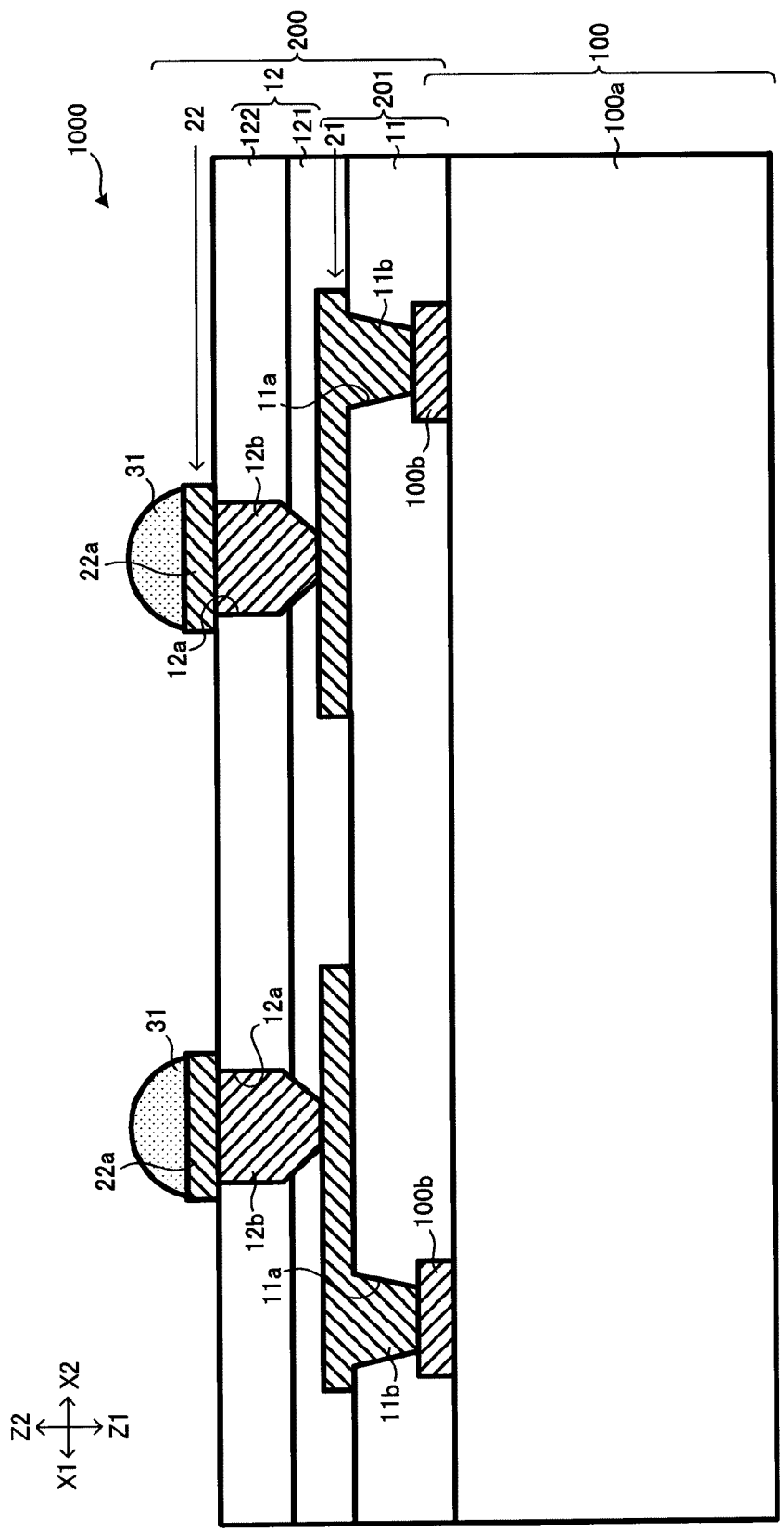
FIG. 1 is a cross-sectional view showing a semiconductor device having a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction corresponding to a direction along a normal line (or a thickness direction) to the main surfaces (upper and lower surfaces) of each layer. On the other hand, arrows (X1, X2) and (Y1, Y2) each indicate a direction perpendicular to a lamination direction (directions parallel to the main surfaces of each layer). The main surfaces of a wiring board are on the X-Y plane. Side surfaces of each layer are on the X-Z plane or the Y-Z plane.

Regarding a via conductor or its hole, a cross section (X-Y plane) perpendicular to a direction Z (a depth direction) is referred to as a horizontal cross section. Also, a cross section (X-Z plane or Y-Z plane) parallel to a direction Z (a depth direction) is referred to as a vertical cross section.

Two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In a lamination direction, the side closer to the base (such as semiconductor chip 100) is referred to as a lower layer (or inner-layer side), and the side farther from the base is referred to as an upper layer (or outer-layer side). "Directly on" indicates a direction Z (Z1 side or Z2 side).

Conductive patterns include layers with plain patterns such as a power-source layer or a ground layer; wiring such as signal lines; pads, lands and so forth.

Opening portions include notches, slits and the like along with holes and grooves. Holes include not only penetrating holes but also non-penetrating holes. Holes include via holes and through holes. The conductor formed in a via hole is referred to as a via conductor, and the conductor formed in a through hole is referred to as a through-hole conductor.

Plating indicates depositing a layer of conductor (such as metal) on surfaces of metal, resin or the like as well as the deposited conductive layer (such as a metal layer). Plating includes wet plating such as electroplating and the like as well as dry plating such as PVD (physical vapor deposition) and CVD (chemical vapor deposition).

The "width" of a hole or a column (protrusion) indicates the diameter if it is a circle and $2\sqrt{\text{(cross section}/\pi)}$ if it is not a circle, unless otherwise indicated. When a hole or a column (protrusion) tapers, whether the "widths" of two or more holes or protrusions are the same or different may be determined by comparing values, average values, maximum values or the like of corresponding portions.

As shown in FIG. 1, semiconductor device 1000 of the present embodiment has semiconductor chip 100 (semiconductor element) and wiring board 200 formed on semiconductor chip 100. Wiring board 200 has rewiring section 201, insulation layer 12 (second resin insulation layer) formed on rewiring section 201, via conductors (12b) formed in insulation layer 12, conductive pattern 22 (second conductive pattern) and bumps 31 (bump bodies).

Rewiring section 201 is formed on semiconductor chip 100 (Z2 side). Insulation layer 12 is formed on rewiring section 201 (Z2 side). Multiple holes (12a) (opening portions) are formed in insulation layer 12, and via conductors (12b) are formed in their respective holes (12a). Conductive pattern 22 is formed on insulation layer 12 (Z2 side). Conductive pattern 22 has pads (22a), and bumps 31 are arranged on pads (22a).

Figure 2A:
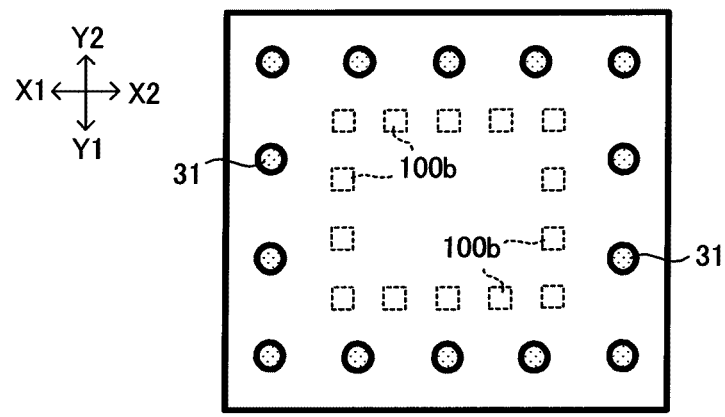
FIG. 2A is a view showing a first example of positioning electrode pads of a semiconductor chip and bumps (external connection terminals) in a fan-in arrangement.
Figure 2B:
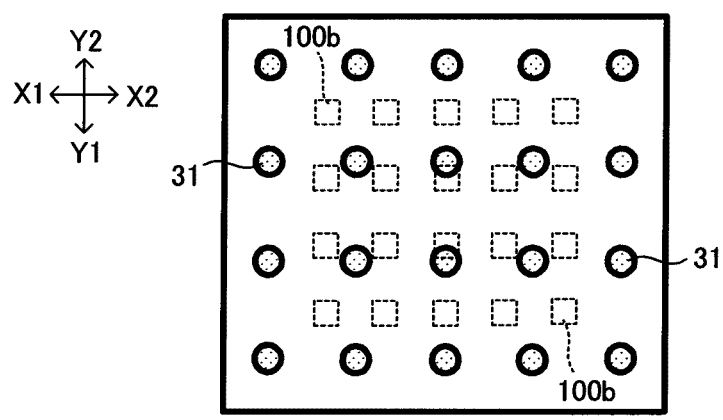
FIG. 2B is a view showing a second example of positioning electrode pads of a semiconductor chip and bumps (external connection terminals) in a fan-in arrangement.

In semiconductor device 1000 of the present embodiment, terminal pitches fan in from semiconductor chip 100 (inner-layer side) toward bumps 31 (outer-layer side) as terminals are repositioned through rewiring section 201. Here, positioning electrode pads (100b) of semiconductor chip 100 (inner-layer side terminals) and bumps 31 (outer-layer side terminals) may be determined freely. For example, as shown in FIG. 2A, electrode pads (100b) may be positioned in a peripheral style (peripheral-terminal type), while bumps 31 are positioned in a peripheral style (peripheral-terminal type) with a wider terminal pitch. Alternatively, as shown in FIG. 2B, for example, electrode pads (100b) may be positioned in an area-array style, while bumps 31 are positioned in an area-array style with a wider terminal pitch.

Semiconductor chip 100 has chip body (100a) and multiple electrode pads (100b). Electrode pads (100b) are arranged on chip body (100a) with predetermined positioning (see FIGS. 2A and 2B, for example). Semiconductor chip 100 is an IC chip with integrated elements such as resistor, diode, transistor and capacitor. Chip body (100a) is made of silicon, for example. However, the present embodiment is not limited to such, and other semiconductor chips such as a semiconductor laser may also be used as semiconductor chip 100.

Rewiring section 201 has insulation layer 11 (first resin insulation layer) formed on semiconductor chip 100, via conductors (11b) and conductive pattern 21. Conductive pattern 21 is formed on insulation layer 11 (Z2 side) and widens the terminal pitch of semiconductor chip 100. Holes (11a) (via holes) are formed in insulation layer 11. By filling conductor (such as copper plating) in hole (11a), the conductor in hole (11a) becomes via conductor (11b). Lower-layer electrode pad (100b) is electrically connected to upper-layer conductive pattern 21 through via conductor (11b). Via conductor (11b) is formed to be a tapered column (truncated cone) whose diameter increases from electrode pad (100b) toward conductive pattern 21, for example. The horizontal cross section of via conductor (11b) (X-Y plane) is formed to be a circle, for example. However, via conductor (11b) is not limited to such, and any other structures may also be employed.

Insulation layer 11 is made of polyimide, for example. However, the material for insulation layer 11 is not limited to polyimide, and it may be wiring barrier film using an inorganic insulator or low-temperature inorganic glass, for example: Conductive pattern 21 is double-layered with electroless copper plating (lower layer) and electrolytic copper plating (upper layer), for example. However, the material for conductive pattern 21 is not limited specifically. For example, copper foil may be added beneath the electroless plating. Alternatively, conductive pattern 21 may be formed only with electroless copper plating. Yet alternatively, the material for conductive pattern 21 may be conductors other than copper.

Insulation layer 12 is formed with first insulation layer 121 (first layer) on the Z1 side and second insulation layer 122 (second layer) on the Z2 side. The elastic coefficient of second insulation layer 122 is set lower than that of first insulation layer 121. By arranging an insulation layer (first insulation layer 121) with a higher elastic coefficient around the base of via conductor (12b) (on the side of semiconductor chip 100), the stress that is concentrated on the base is considered to be dispersed to the side of bump 31. In this case, the elastic coefficient of first insulation layer 121 is especially preferred to be in a range of 5~10 GPa, and the elastic coefficient of second insulation layer 122 to be in a range of 0.01~0.1 GPa. Following is an example which can be easily obtained using a commercially available insulation material and is preferable from the viewpoints of cost, insulation and the like: The elastic coefficient of first insulation layer 121 is 7.5 GPa or 9.8 GPa, for example, and the elastic coefficient of second insulation layer 122 is 0.028 GPa, for example.

First insulation layer 121 and second insulation layer 122 are made of epoxy resin, for example. However, the material for insulation layer 12 is not limited specifically. The structure of insulation layer 12 is not limited to being double layered, and it may be formed with one layer or three or more layers (see later-described FIGS. 17 and 18).

Hole (12a) (via hole) is formed in insulation layer 12 and conductor (such as copper plating) is filled in hole (12a). The conductor in hole (12a) becomes via conductor (12b). Via conductor (12b) electrically connects wiring (21a) of conductive pattern 21 and pad (22a) of conductive pattern 22.

Bump 31 is arranged directly on a land (pad (22a)) of conductive pattern 22 on the Z2 side of via conductor (12b). Bump 31 is a solder bump, for example. Through bump 31, wiring board 200 may be connected with another wiring board, or an electronic component may be mounted on wiring board 200.

In the present embodiment, via conductor (12b) is formed with tapered portion (121b) and non-tapered portion (122b). The boundary between tapered portion (121b) and non-tapered portion (122b) becomes the bent portion. Namely, the inclination of the side surface of via conductor (12b) in a depth direction changes at the bent portion. Via conductor (12b) has tapered portion (121b) on the Z1 side and non-tapered portion (122b) on the Z2 side.

Tapered portion (121b) is configured, for example, to be a tapered column (truncated cone) in which the diameter increases from the side of conductive pattern 21 toward conductive pattern 22. Namely, a vertical cross section of tapered portion (121b) is substantially trapezoidal. The end surface (F2) on the Z1 side of via conductor (12b) is formed with tapered surface (F21) and flat top surface (F22). Namely, part of end surface (F2) tapers. Top surface (F22) is in contact with wiring (21a) of conductive pattern 21. Because of tapered surface (F21), via conductor (12b) becomes gradually thinner toward the Z1 side (lower layer). The greater the taper angle, the greater the degree at which the diameter decreases or increases.

Figure 4:
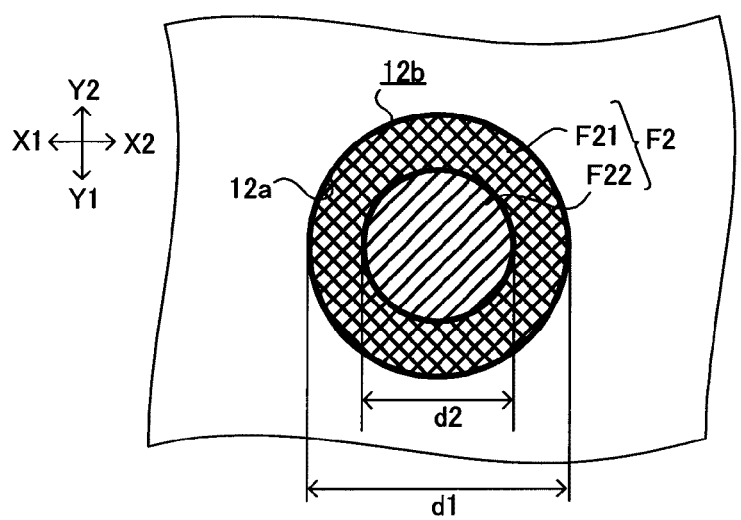
FIG. 4 is a view showing a planar structure of a via conductor.

As shown in FIG. 4, for example, top surface (F22) is positioned in the center of via conductor (12b), and tapered surface (F21) is formed annularly around top surface (F22), for example. However, the present embodiment is not limited to such, and top surface (F22) and tapered surface (F21) may be formed freely (see later-described FIG. 25).

Tapered surface (F21) is formed to be an inclined surface (a plane), for example. However, tapered surface (F21) is not limited to such, and it may also be a curved surface (see later-described FIG. 19).

On the other hand, non-tapered portion (122b) is not tapered and is formed to be a column, for example. Namely, a vertical cross section of non-tapered portion (122b) is substantially quadrangular. Angle ($\theta 2$) between a main surface of insulation layer 12 and side surface (F23) of non-tapered portion (122b) is approximately 90 degrees.

A horizontal cross section (X-Y plane) of via conductor (12b) and hole (12a) is circular, for example, as shown in FIG. 4. A horizontal cross section of top surface (F22) is also circular, for example. However, they are not limited to such (see later-described FIGS. 26 and 27).

The position (Z coordinate) of bent portion (L1) (boundary) between tapered portion (121b) and non-tapered portion (122b) is in second insulation layer 122.

In the present embodiment, via conductor (12b) and hole (12a) taper from a certain point (bent portion (L1)) between pad (22a) of conductive pattern 22 (second conductive pattern) and wiring (21a) of conductive pattern 21 (first conductive pattern) as described above.

Here, bent portion (L1) (a point from where tapering starts) is preferred to be in second insulation layer 122. Since cracking tends to occur originating at an angular portion such as bent portion (L1), thermal stress is mitigated by the softness (lower elastic coefficient) of the area where bent portion (L1) is located and cracking is suppressed from occurring. In the following, the reasons are further described while comparing semiconductor device 1000 of the present embodiment with Comparative Examples (1) and (2).

Figure 5A:
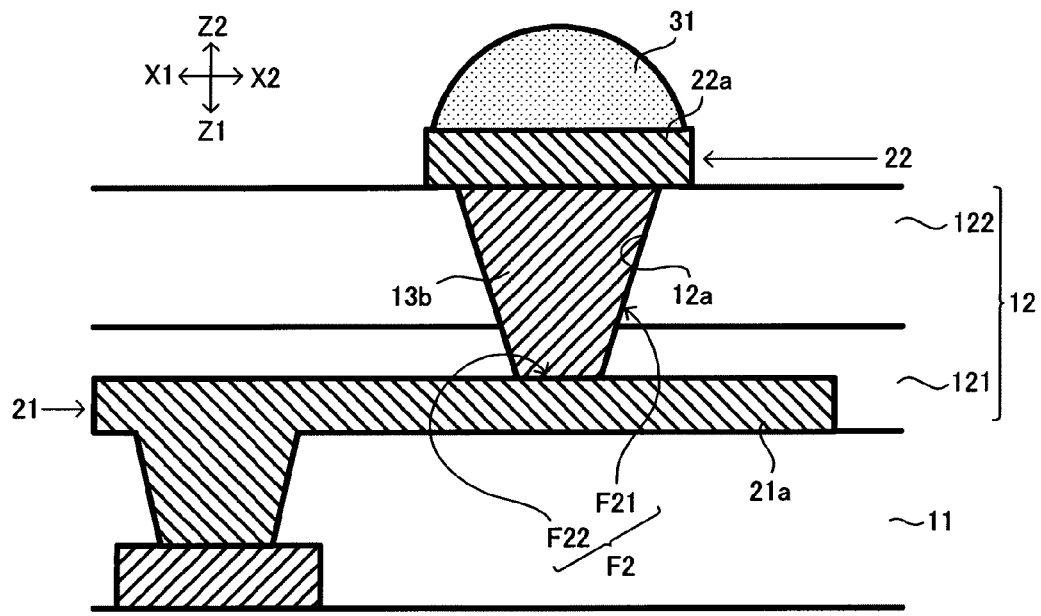
FIG. 5A is a cross-sectional view of a via conductor according to a Comparative Example (1)

Via conductor (13b) of Comparative Example (1) does not have a non-tapered portion and is formed only with a tapered portion as shown in FIG. 5A. Via conductor (13b) is formed to be a tapered column (truncated cone) whose diameter increases from the base (second surface of conductive pattern 21) toward conductive pattern 22.

Figure 5B:
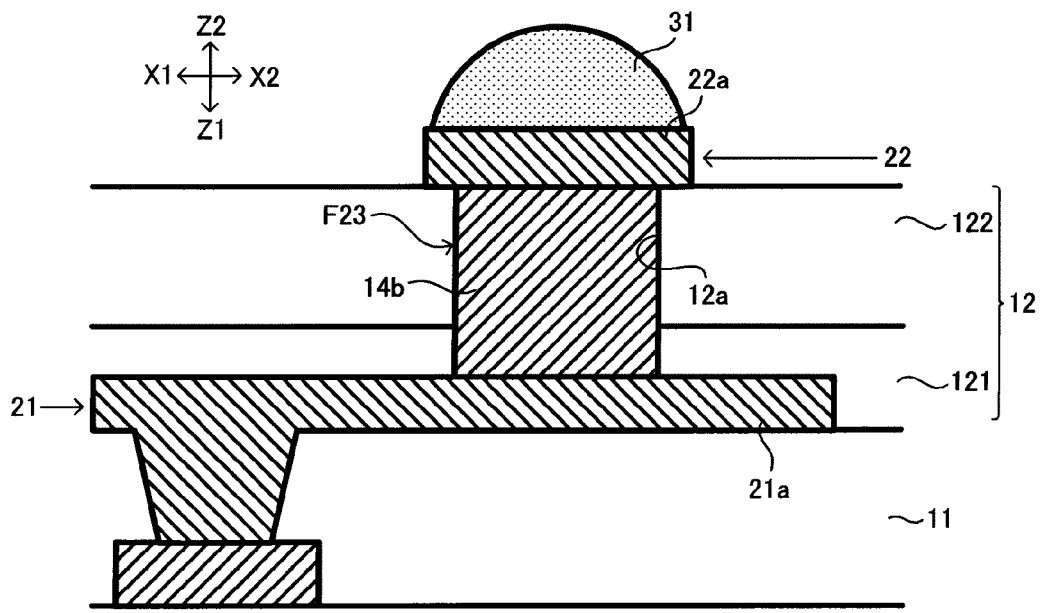
FIG. 5B is a cross-sectional view of a via conductor according to a Comparative Example (2)

As shown in FIG. 5B, via conductor (14b) of Comparative Example (2) does not have a tapered portion and is formed only with a non-tapered portion. Via conductor (14b) is formed to be a column.

FIG. 6 shows simulation results of durability tests, carried out respectively on via conductor (12b) (FIG. 3), via conductor (13b) (FIG. 5A) and via conductor (14b) (FIG. 5B).

As the simulation results show in FIG. 6, following are the values of the stress measured at the base (second surface of conductive pattern 21) where the maximum stress is observed in each via conductor: 342 MPa in via conductor (12b) of the present embodiment; 566 MPa in via conductor (13b) of Comparative Example (1); and 339 MPa in via conductor (14b) of Comparative Example (2). In via conductor (12b) of the present embodiment, substantially the same measurement was obtained as in via conductor (14b) in Comparative Example (2), which does not have a tapered portion. In addition, although via conductor (12b) (FIG. 3) has tapered portion (121b), the stress exerted on its base (maximum stress) is fairly small compared with via conductor (13b). The reasons for that are as follows.

Since hole (12a) of via conductor (12b) tapers from a certain point (bent portion L1), the actual surface size of via conductor (12b) increases compared with that of via conductor (13b). Accordingly, since the contact size increases between via conductor (12b) and insulation layer 12, when stress is generated in bump 31, for example, and the stress is transmitted to via conductor (12b), such stress tends to be dispersed. As a result, stress exerted on the base (bottom portion) of via conductor (12b) is mitigated and delamination, wire disconnection or the like is suppressed in via conductor (12b). Moreover, since the area where bent portion (L1) is positioned is soft (lower elastic coefficient) in via conductor (12b) of the present embodiment, cracking is suppressed from occurring as described above.

As described above, semiconductor device 1000 (FIG. 1) of the present embodiment has higher reliability in electrical connections, insulation and the like than via conductor (13b) of Comparative Example (1). Moreover, compared with via conductor (14b) of Comparative Example (2) which is difficult to form, via conductor (12b) of the present embodiment is formed easily by the later-described manufacturing method. Therefore, using via conductor (12b) (FIGS. 3, 4) of the present embodiment, semiconductor device 1000 (FIG. 1) with higher reliability of electrical connections, insulation and the like is considered to be manufactured easily. The above structure is especially effective in wafer-level packaging.

Next, a method is described for manufacturing the above semiconductor device 1000. In the present embodiment, semiconductor device 1000 is manufactured by a method shown in FIG. 7.

Figure 8:
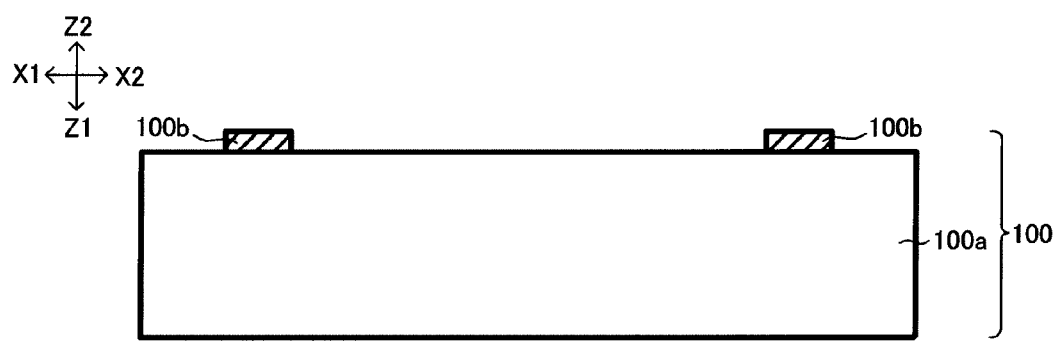
FIG. 8 is a view to illustrate a first step for manufacturing a semiconductor device according to the embodiment of the present invention.

In step (S11), semiconductor chip 100 (support body) is prepared as shown in FIG. 8. As described above, semiconductor chip 100 is an IC chip, for example.

Figure 7:
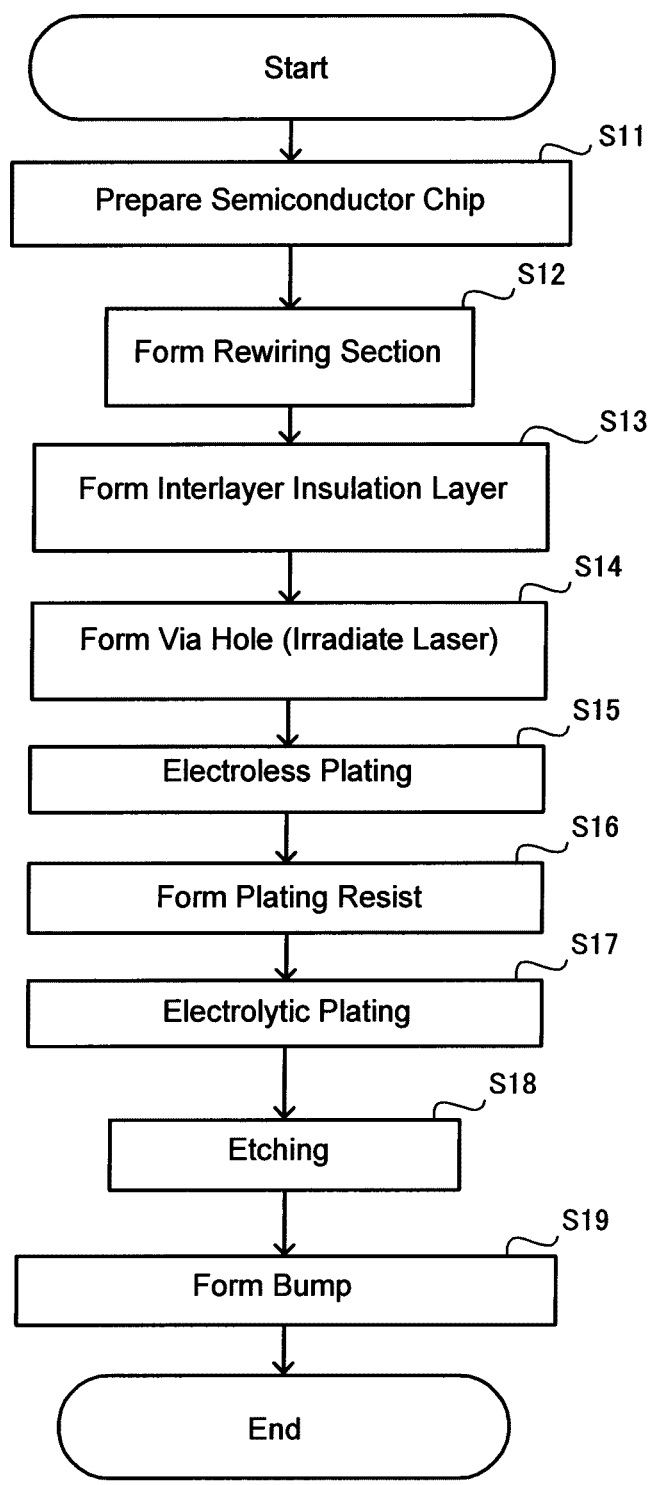
FIG. 7 is a flowchart showing a method for manufacturing a semiconductor device having a wiring board according to an embodiment of the present invention.

Next, in step (S12) in FIG. 7, rewiring section 201 is formed.

Figure 9:
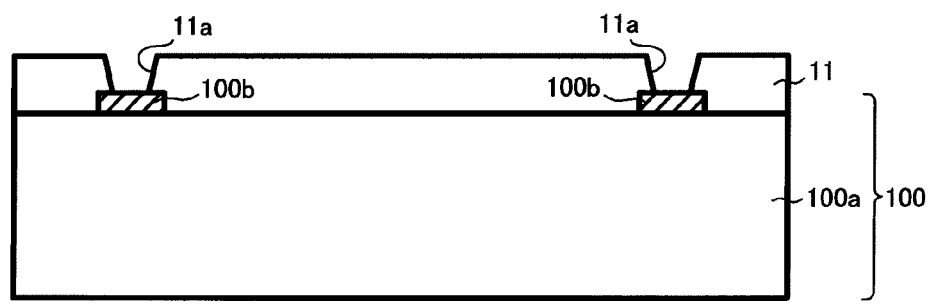
FIG. 9 is a view to illustrate a second step subsequent to the step shown in FIG. 8.

As shown in FIG. 9, on semiconductor chip 100 (Z2 side) insulation layer 11 is formed by lamination, for example. As described above, insulation layer 11 is made of polyimide, for example. Next, using a laser, for example, hole (11a) is formed in insulation layer 11. Hole (11a) reaches electrode pad (100b) of semiconductor chip 100. Then, desmearing and soft etching are conducted if required.

Figure 10:
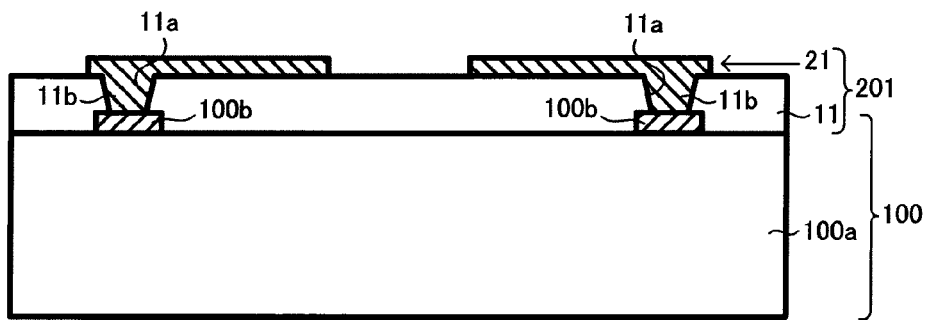
FIG. 10 is a view to illustrate a third step subsequent to the step shown in FIG. 9.

Next, as shown in FIG. 10, using a full additive method, semi-additive (SAP) method, subtractive method or the like, for example, via conductor (11b) is formed in hole (11a), and conductive pattern 21 is formed on insulation layer 11. Accordingly, rewiring section 201 is completed.

Next, in step (S13) in FIG. 7, an interlayer insulation layer (insulation layer 12) is formed.

Figure 11:
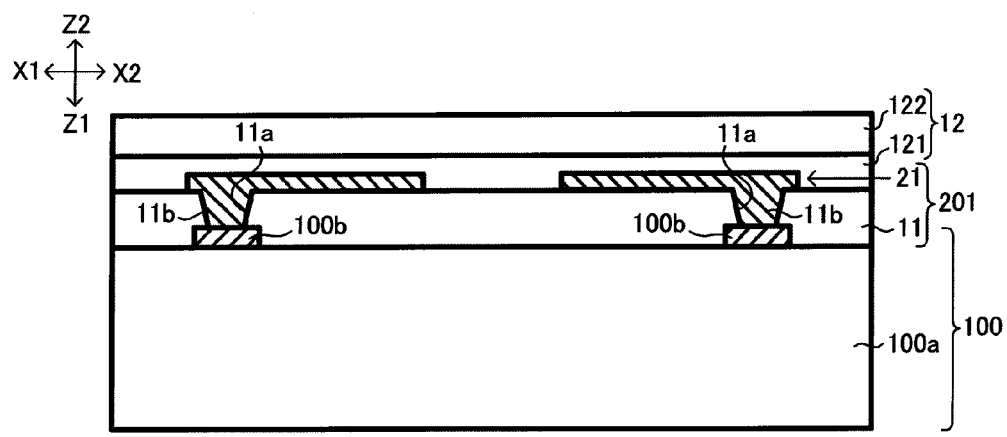
FIG. 11 is a view to illustrate a fourth step subsequent to the step shown in FIG. 10.

As shown in FIG. 11, insulation layer 12 is formed by lamination, for example, on insulation layer 11 (Z2 side) and conductive pattern 21 (Z2 side) in rewiring section 201. As described above, since insulation layer 12 is double-layered with first insulation layer 121 (Z1 side) and second insulation layer 122 (Z2 side), those layers are formed one by one. The elastic coefficient of first insulation layer 121 is in the range of 5~10 GPa, for example, and the elastic coefficient of second insulation layer 122 is in the range of 0.01~0.1 GPa, for example.

Figure 12:
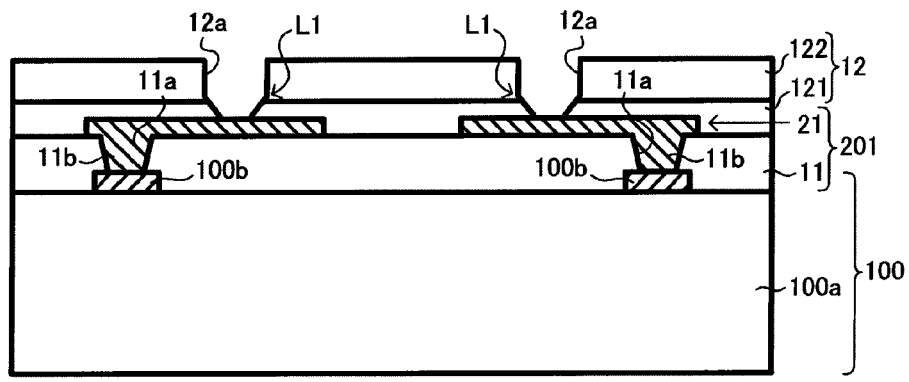
FIG. 12 is a view to illustrate a fifth step subsequent to the step shown in FIG. 11.

Next, in step (S14) in FIG. 7, a via hole is formed. In particular, using a laser, for example, hole (12a) (via hole) is formed in insulation layer 12 as shown in FIG. 12.

Figure 3:
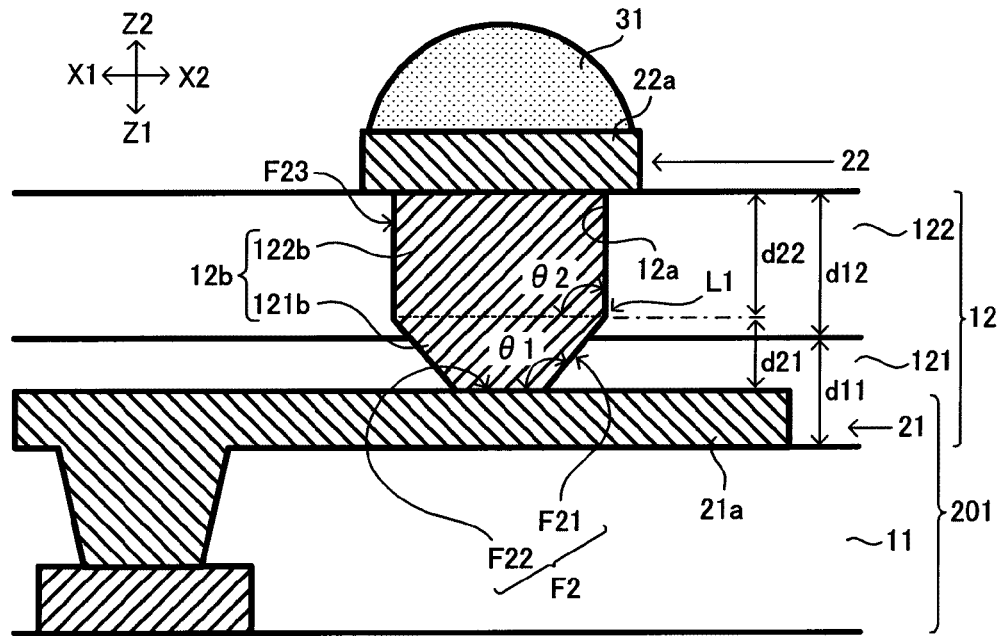
FIG. 3 is a magnified view showing part of FIG. 1.

During that time, laser intensity (amount of light) is preferred to be adjusted by pulse control. In particular, for example, when laser intensity is modified, the number of shots (irradiation number) is changed without modifying laser intensity per shot (one irradiation). Namely, if the required laser intensity is not obtained by one shot, a laser is irradiated again at the same irradiation spot. Since such a control method saves time for modifying irradiation conditions, throughput is enhanced. Also, with multiple laser irradiations, it is easier to form hole (12a) which tapers from a certain point as shown in FIGS. 3 and 4.

In the present embodiment, a laser is irradiated at the same spot 3~5 times under the same conditions, for example. In doing so, hole (12a) (see FIGS. 3 and 4 for detail) is formed in first insulation layer 121 and second insulation layer 122. Bent portion (L1) positioned in the boundary between tapered portion (121b) and non-tapered portion (122b) is formed in second insulation layer 122. However, the method for adjusting laser intensity is not limited specifically. For example, irradiation conditions may be determined for each irradiation spot, and the number of irradiations may be set constant (for example, one shot per irradiation spot). Alternatively, laser intensity per shot may be modified when a laser is irradiated multiple times at the same irradiation spot.

Hole (12a) reaches conductive pattern 21. Then, desmearing and soft etching are conducted if required.

Figure 13:
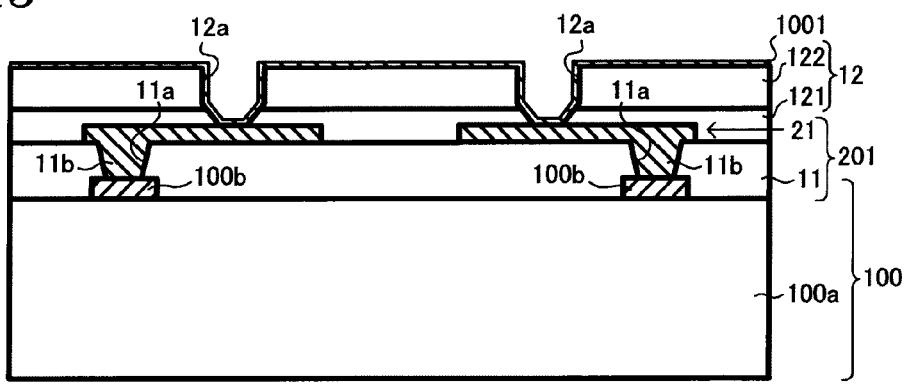
FIG. 13 is a view to illustrate a sixth step subsequent to the step shown in FIG. 12.

Next, in step (S15) in FIG. 7, electroless plating is performed. In particular, as shown in FIG. 13, by copper panel plating (plating the entire surface including the inside of hole (12a)), for example, seed layer 1001 is formed on the second surface of insulation layer 12 and inside hole (12a). Panel plating is conducted by wet electroless plating, dry sputtering or the like, for example.

Figure 14:
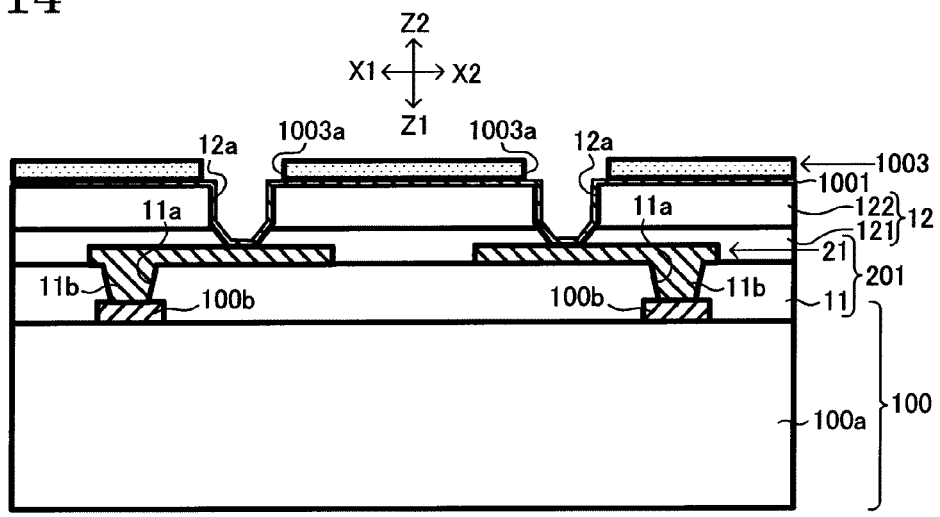
FIG. 14 is a view to illustrate a seventh step subsequent to the step shown in FIG. 13.

Next, in step (S16) in FIG. 7, plating resist is formed. In particular, plating resist is applied on electrolytic plating 1002 (entire surface), and the applied plating resist is patterned using a lithographic technique, for example. In doing so, plating resist 1003 is formed, having opening portion (1003a) around hole (12a) as shown in FIG. 14. Plating resist 1003 has a pattern corresponding to conductive pattern 22 (FIG. 1).

Figure 15:
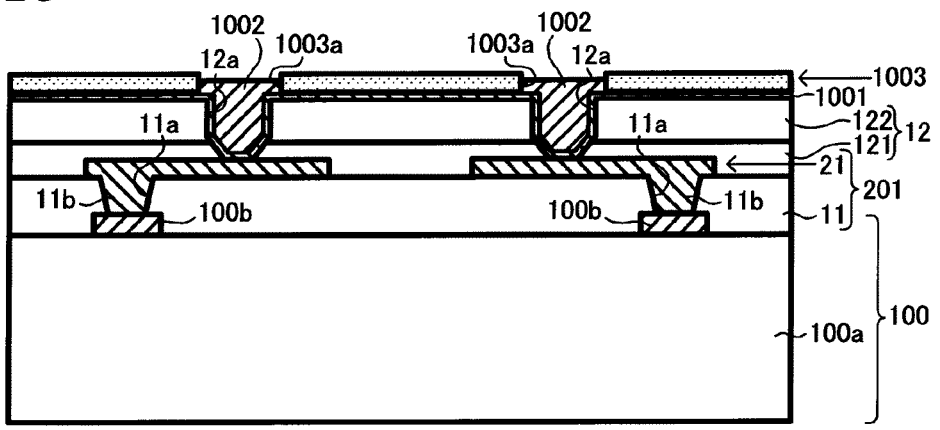
FIG. 15 is a view to illustrate an eighth step subsequent to the step shown in FIG. 14.

Next, in step (S17) in FIG. 7, electrolytic plating is performed. In particular, as shown in FIG. 15, by performing electrolytic plating using seed layer 1001 as a feed layer, for example, electrolytic copper plating 1002, for example, is formed in opening portion (1003a) of plating resist 1003. Accordingly, conductor (seed layer 1001 and electrolytic plating 1002) is filled in hole (12a). Then, plating resist 1003 is removed.

Figure 16:
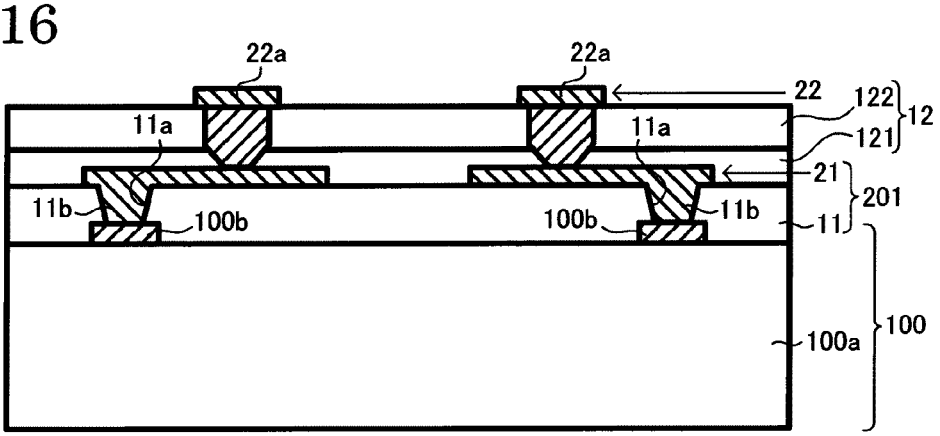
FIG. 16 is a view to illustrate a ninth step subsequent to the step shown in FIG. 15.

Next, in step (S18) in FIG. 7, unnecessary electroless plating (seed layer 1001) is removed by etching. In doing so, as shown in FIG. 16, conductive pattern 22 is formed as previously shown in FIG. 1. Conductive pattern 22 has pad (22a). In the present embodiment, conductive pattern 22 is formed using a semi-additive (SAP) method as described above. However, forming conductive pattern 22 is not limited to the above method, and a full-additive method or a subtractive method, for example, may also be used.

Next, in step (S19) in FIG. 7, bump 31 (FIG. 1) is formed on pad (22a) of conductive pattern 22. In particular, flux is applied, for example, and a solder ball is loaded onto pad (22a) through the flux. Then, semiconductor chip 100 with the loaded solder ball is reflowed (thermal treatment). Accordingly, bump 31 is formed on pad (22a) of conductive pattern 22, and semiconductor device 1000 along with wiring board 200 is completed as previously shown in FIG. 1.

As described above, according to a manufacturing method of the present embodiment, wiring board 200 with high reliability, specifically semiconductor device 1000 (FIG. 1), is easily manufactured.

So far, a wiring board and its manufacturing method according to an embodiment of the present invention have been described. However, the present invention is not limited to the above embodiment.

Figure 17:
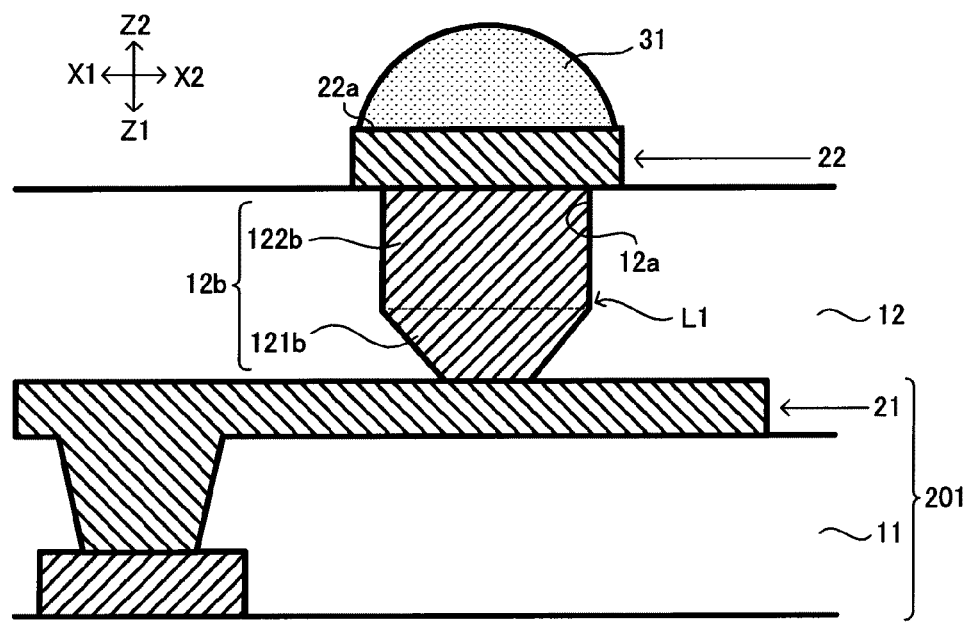
FIG. 17 is a cross-sectional view showing an example in which an insulation layer (outermost layer) is single-layered.

In the above embodiment, an example has been described in which insulation layer 12 is double-layered. However, as shown in FIG. 17, insulation layer 12 may be formed with a single layer or, as shown in FIG. 18, insulation layer 12 may also be formed with three or more layers.

Figure 18:
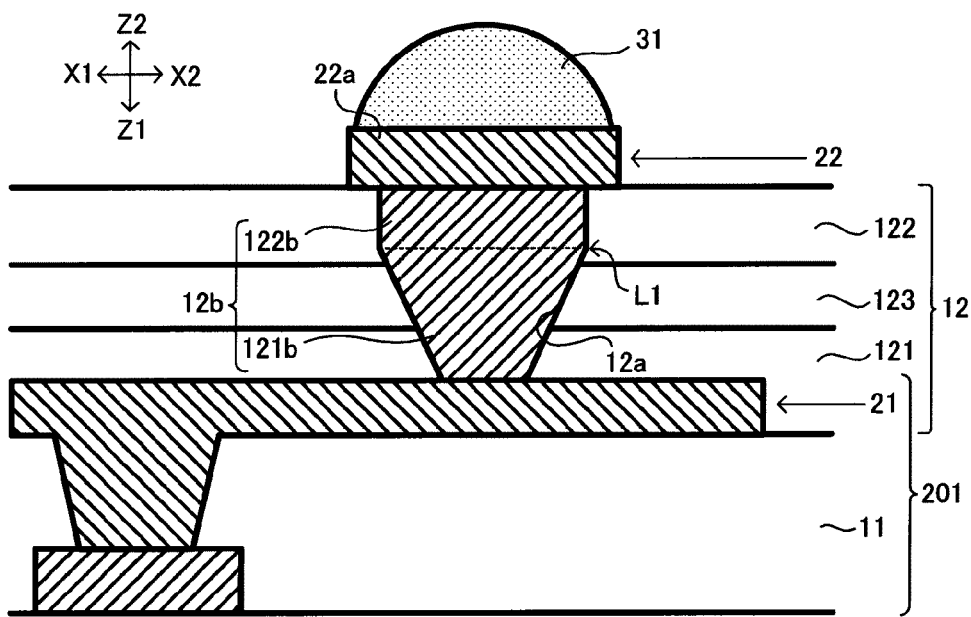
FIG. 18 is a cross-sectional view showing an example in which an insulation layer (outermost layer) is triple-layered.

In an example shown in FIG. 18, insulation layer 12 is formed with first insulation layer 121, second insulation layer 122 and third insulation layer 123. Third insulation layer 123 is sandwiched between first insulation layer 121 (Z1 side) and second insulation layer 122 (Z2 side). In such a structure having three or more layers, the elastic coefficient of first insulation layer 121 (first layer) positioned closest to conductive pattern 21 (first conductive pattern) is preferred to be higher than the elastic coefficient of second insulation layer 122 (second layer) positioned closest to conductive pattern 22 (second conductive pattern). As described, by positioning an insulation layer (first insulation layer 121) with a higher elastic coefficient near the base of via conductor (12b) (the side of semiconductor chip 100), stress concentrated on the base is dispersed to the side of bump 31. Furthermore, the elastic coefficient is preferred to be higher on the side of conductive pattern 21 (first conductive pattern) and to gradually become lower toward the side of conductive pattern 22 (second conductive pattern). In such a case, insulation layer 12 has a higher elastic coefficient in areas closer to first insulation layer 121. According to such a structure, stress is mitigated more efficiently. In an example shown in FIG. 18, elastic coefficients of first insulation layer 121, third insulation layer 123 and second insulation layer 122 are preferred to be listed from the highest in that order.

Elastic coefficients are noted in the above description. However, the same applies to thermal expansion coefficients. Regarding thermal expansion coefficients, they have a relationship opposite to that of elastic coefficients. Namely, the thermal expansion coefficient of first insulation layer 121 (first layer) positioned closest to conductive pattern 21 (first conductive pattern) is preferred to be lower than the thermal expansion coefficient of second insulation layer 122 (second layer) positioned closest to conductive pattern 22 (second conductive pattern). In addition, the thermal expansion coefficient is preferred to be lower on the side of conductive pattern 21 (first conductive pattern) and to gradually become higher toward conductive pattern 22 (second conductive pattern).

Bent portion (L1) is preferred to be in a layer having the lowest elastic coefficient (second insulation layer 122, for example) among the layers that form insulation layer 12. Since cracking tends to occur in an angular area such as bent portion (L1), cracking is suppressed from occurring because the area of bent portion (L1) is soft (lower elastic coefficient). Also, if bent portion (L1) is in a layer having the highest thermal expansion coefficient (second insulation layer 122, for example) among the layers that form insulation layer 12, then substantially the same effects are considered to be achieved.

The same effects are achieved if insulation layer 12 is formed with four or more layers.

Figure 19:
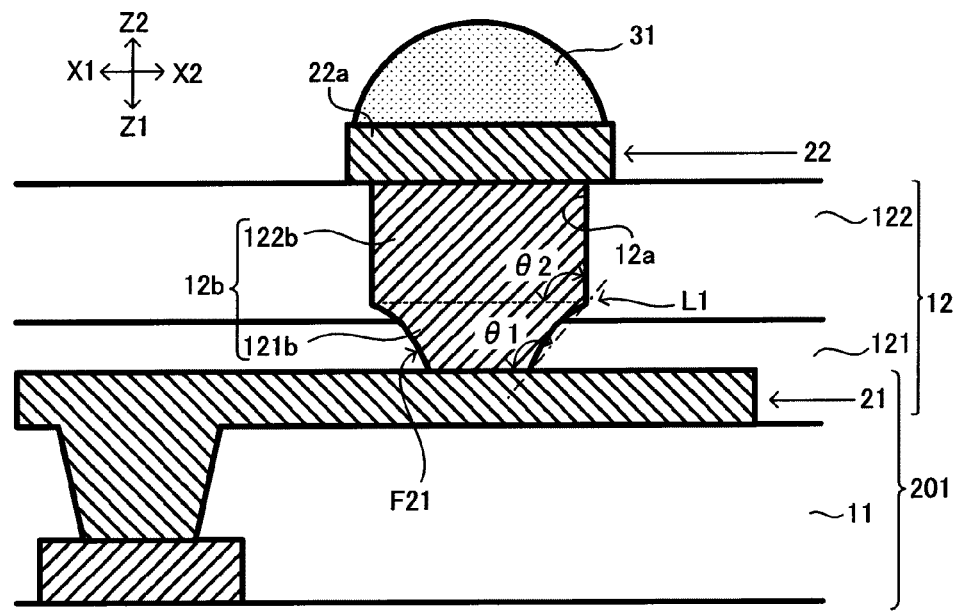
FIG. 19 is a cross-sectional view showing an example in which a tapered surface is curved.

In the above embodiment, an example has been described in which tapered surface (F21) is an inclined surface (a plane). However, as shown in FIG. 19, tapered surface (F21) may also be a curved surface.

In the above embodiment, a structure having non-tapered portion (122b) is described; namely, the structure of via conductor (12b) which tapers from a certain point (bent portion L1) is described. However, via conductor (12b) may also be formed without non-tapered portion (122b), as shown in FIGS. 20~24.

Figure 20:
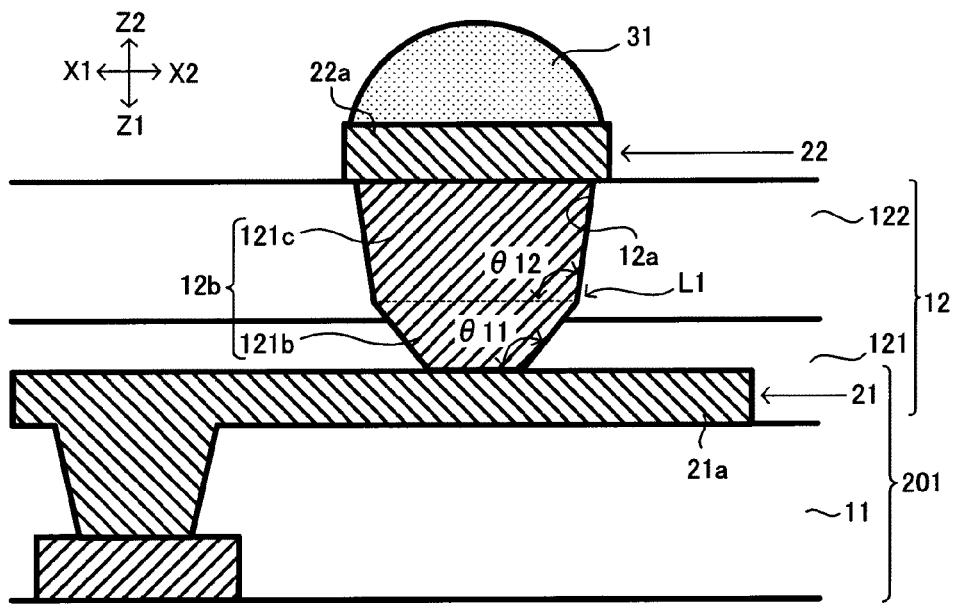
FIG. 20 is a cross-sectional view showing a first example of a via conductor which has multiple taper angles decreasing in stages from a lower layer toward an upper layer.

In an example shown in FIG. 20, via conductor (12b) is formed with multiple tapered portions (121b, 121c) each having a different taper angle. Namely, via conductor (12b) tapers at multiple different taper angles (θ11, θ12). Tapered portion (121c) is positioned to the Z2 side of tapered portion (121b). In order to mitigate stress, taper angles (θ11, θ12) in via conductor (12b) are preferred to become smaller (θ11>θ12) in stages from conductive pattern 21 toward conductive pattern 22. In this case, bent portion (L1) positioned in the boundary between tapered portion (121b) and tapered portion (121c) is also preferred to be in a layer with a lower elastic coefficient (second insulation layer 122, for example). Cracking is suppressed as described above.

Figure 21:
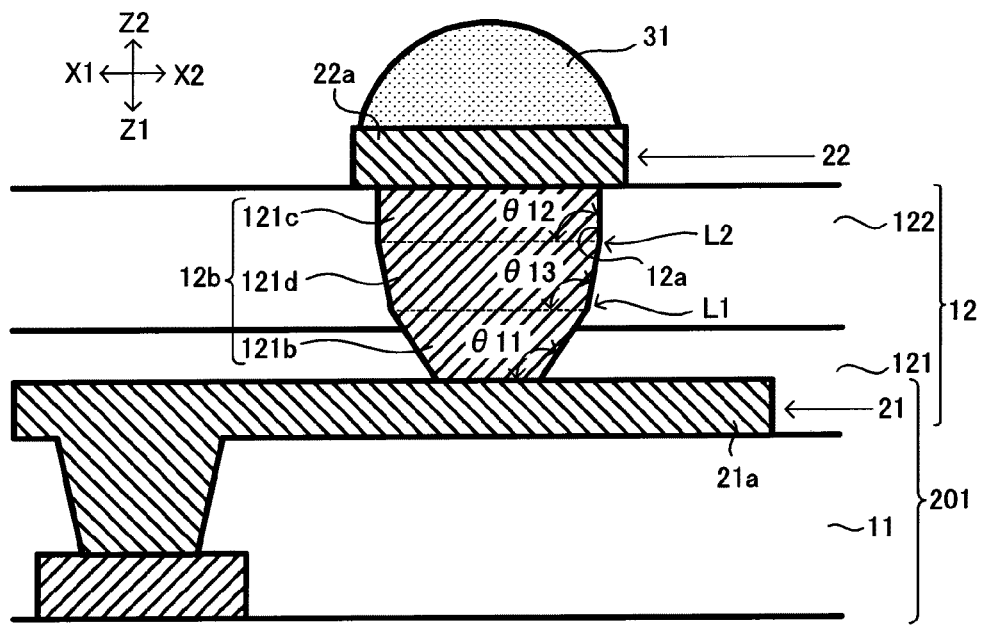
FIG. 21 is a cross-sectional view showing a second example of a via conductor which has multiple taper angles decreasing in stages from a lower layer toward an upper layer.
Figure 22:
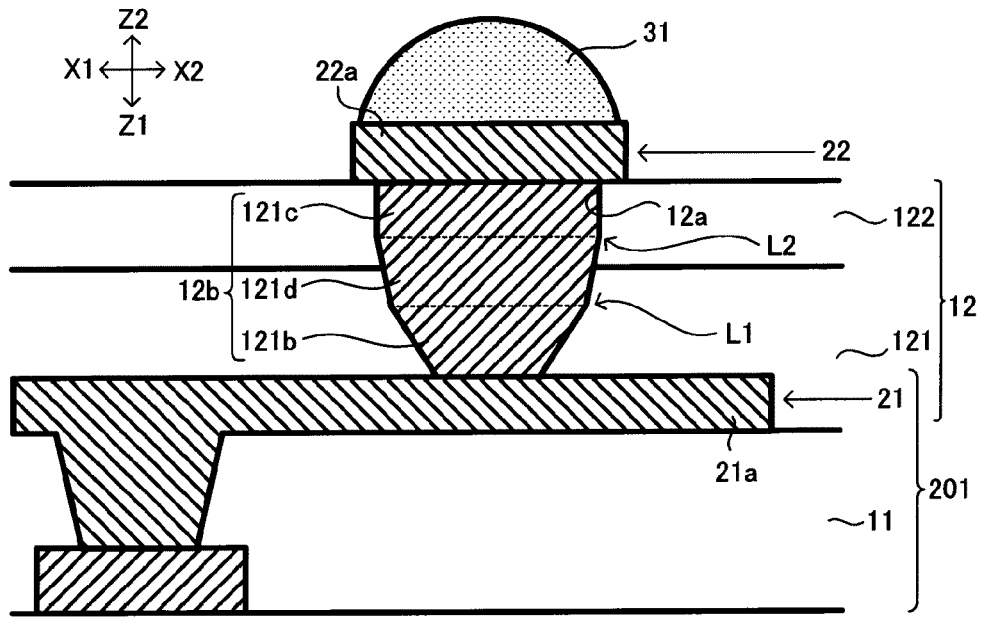
FIG. 22 is a cross-sectional view showing a third example of a via conductor which has multiple taper angles decreasing in stages from a lower layer toward an upper layer.
Figure 23:
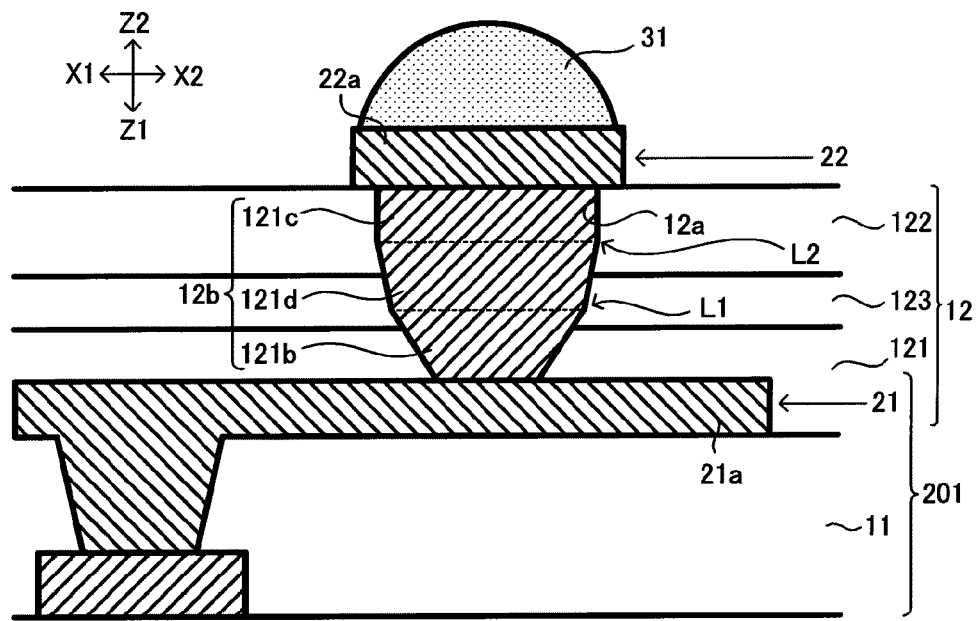
FIG. 23 is a cross-sectional view showing a fourth example of a via conductor which has multiple taper angles decreasing in stages from a lower layer toward an upper layer.
Figure 24:
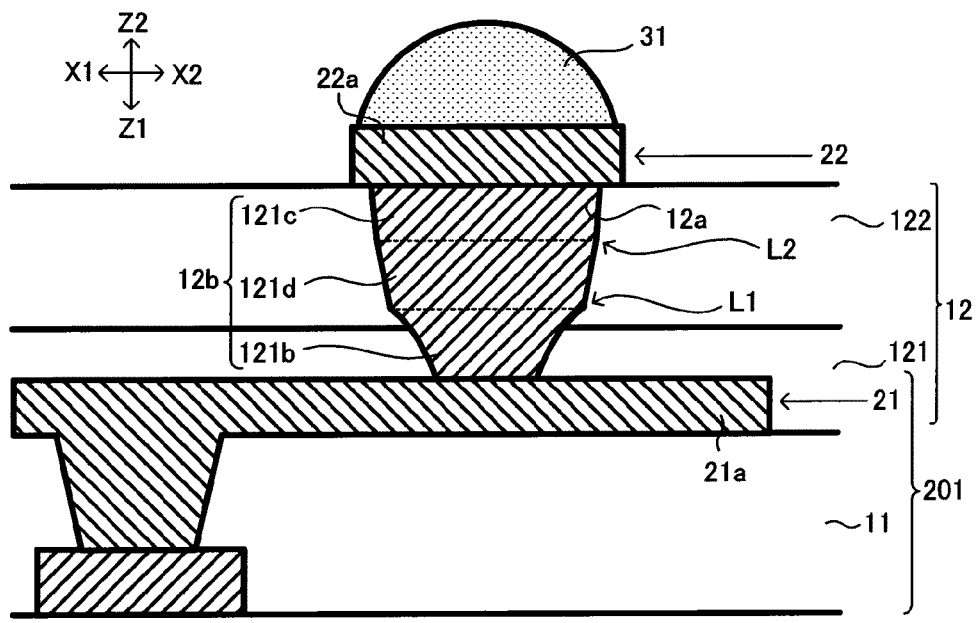
FIG. 24 is a cross-sectional view showing a fifth example of a via conductor which has multiple taper angles decreasing in stages from a lower layer toward an upper layer.

In an example shown in FIG. 21, via conductor (12b) is formed with multiple tapered portions (121b, 121c, 121d) having different taper angles. Namely, via conductor (12b) tapers at multiple different taper angles (θ11, θ12, θ13). Tapered portion (121d) is sandwiched between tapered portion (121b) (Z1 side) and tapered portion (121c) (Z2 side). In order to mitigate stress, taper angles (θ11~θ13) in via conductor (12b) are preferred to become smaller (θ11>θ13>θ12) in stages from conductive pattern 21 toward conductive pattern 22. In this case, bent portion (L1) (one of the portions where taper angles change) positioned in the boundary between tapered portion (121b) and tapered portion (121d) along with bent portion (L2) (one of the portions where taper angles change) positioned in the boundary between tapered portion (121d) and tapered portion (121c) are also preferred to be in a layer with a lower elastic coefficient (second insulation layer 122, for example), because cracking is suppressed as described above. However, as shown in FIG. 22, if at least either bent portion (L1) or (L2) (bent portion L2, for example) is in a layer having a lower elastic coefficient (second insulation layer 122, for example), substantially the same effects as above are considered to be achieved. Alternatively, as shown in FIG. 23, if there are three or more layers, at least either bent portion (L1) or (L2) (bent portion L2, for example) is preferred to be in a layer having the lowest elastic coefficient (second insulation layer 122, for example) among the layers that form insulation layer 12. As shown in FIG. 24, tapered surfaces of tapered portions (121b, 121c, 121d) may include a curved surface.

Top surface (F22), tapered surface (F21) and hole (12a) are not limited to those shown in FIG. 4, and they may also be modified appropriately.

Figure 25:
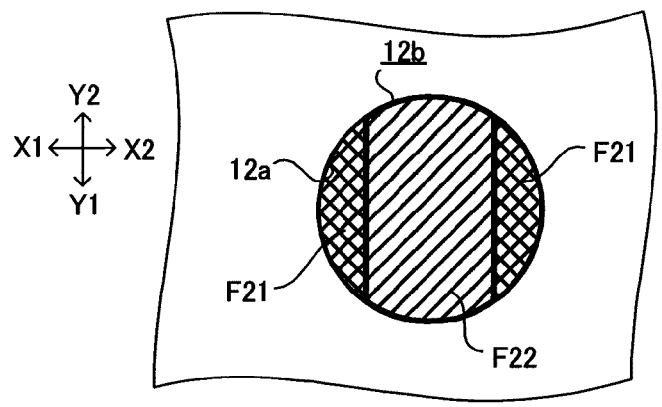
FIG. 25 is a view showing an example in which only two sides of the top surface taper.

For example, as shown in FIG. 25, it is also an option that only the X1 side and X2 side of top surface (F22) taper.

Figure 26:
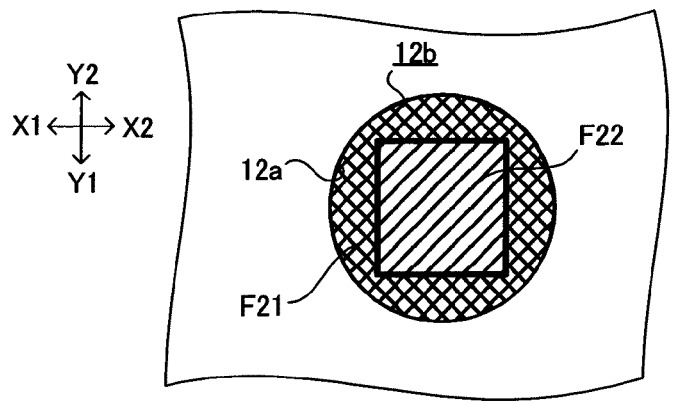
FIG. 26 is a view showing an example in which a horizontal cross section (X-Y plane) on the top surface is formed to be a quadrangle.

A horizontal cross section (X-Y plane) of top surface (F22) may also be formed to be a polygon such as a quadrangle as shown in FIG. 26, for example.

Figure 27:
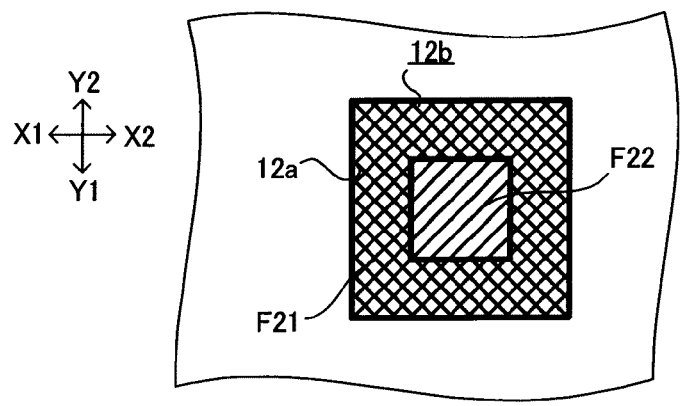
FIG. 27 is a view showing an example in which a horizontal cross section (X-Y plane) of a hole is formed to be a quadrangle.

The Z2-side opening surface (X-Y plane) of hole (12a) may also be formed to be a polygon such as a quadrangle as shown in FIG. 27, for example.

Regarding other features, the structure of the above semiconductor device 1000 and its elements such as the type, performance, measurements, quality, structure, number of layers, positioning and so forth may be modified freely within a scope that does not deviate from the gist of the invention.

For example, instead of hole (12a), opening portions other than holes, such as grooves and notches, may also be used.

The material for each conductive pattern is not limited to the above, and may be modified according to usage requirements or the like. For example, metal other than copper may be used as the material for conductive patterns. Also, the material for each insulation layer is not limited to a specific type. However, as for resins to form interlayer insulation layers, thermosetting resins or thermoplastic resins are preferred. As for thermosetting resins, other than epoxy resin and polyimide, the following may be used, for example: BT resin, allyl polyphenylene ether resin (A-PPE resin) or aramid resin. Also, as for thermoplastic resins, for example, liquid-crystal polymer (LCP), PEEK resin or PTFE resin (fluoro resin) may be used. Such materials are preferred to be selected according to requirements from the viewpoints of insulation, dielectric properties, tolerance to heat, mechanical features and so forth. In addition, the above resins may contain additives such as a curing agent, a stabilizer, filler or the like. Alternatively, each conductive pattern and each insulation layer may be formed with multiple layers made of different materials.

The manufacturing process of a wiring board is not limited to the order and contents shown in the flowchart in FIG. 7, and the order and contents may be modified freely within a scope that does not deviate from the gist of the present invention. Also, depending on usage requirements or the like, some steps may be omitted.

The above embodiment and its modified examples may be combined freely. It is preferable to select an appropriate combination according to usage requirements or the like.

A wiring board according to the first aspect of the present invention has the following: a first resin insulation layer having a first surface and a second surface opposite the first surface; a first conductive pattern formed on the second surface of the first resin insulation layer; a second resin insulation layer formed on the first conductive pattern and having an opening portion to expose at least part of the first conductive pattern; a second conductive pattern formed on the second resin insulation layer; a via conductor formed in the opening portion and electrically connecting the first conductive pattern and the second conductive pattern; and a bump body formed on the second conductive pattern. The via conductor has a bent portion where the inclination of a side surface changes in a direction of its depth.

A method for manufacturing a wiring board according to the second aspect of the present invention includes the following: forming a first resin insulation layer on a support body; forming a first conductive pattern on the first resin insulation layer; on the first resin insulation layer, forming a second resin insulation layer having an opening portion to expose at least part of the first conductive pattern; forming a second conductive pattern on the second resin insulation layer; in the opening portion, forming a via conductor electrically connecting the first conductive pattern and the second conductive pattern; and forming a bump body on the second conductive pattern. The via conductor is formed to have a bent portion where the inclination of a side surface changes in a direction of its depth.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a first resin insulation layer;
a first conductive pattern formed on the first resin insulation layer;
a second resin insulation layer formed on the first conductive pattern and having an opening portion exposing at least a portion of the first conductive pattern;
a second conductive pattern formed on the second resin insulation layer; and
a via conductor formed in the opening portion of the second resin insulation layer and electrically connecting the first conductive pattern and the second conductive pattern,
wherein the via conductor has a side surface extending between the first conductive pattern and the second conductive pattern and a bent portion where an inclination of the side surface of the via conductor changes in a depth direction of the via conductor, the via conductor tapers from the bent portion toward the first conductive pattern and includes a tapered portion decreasing in size from the bent portion toward the first conductive pattern and a non-tapered portion such that the bent portion forms a boundary between the tapered portion and a non-tapered portion, the second resin insulation layer is formed with a plurality of layers having different elastic coefficients, and the bent portion of the via conductor is formed in a layer having the lowest elastic coefficient among the plurality of layers forming the second resin insulation layer.

2. The wiring board according to claim 1, further comprising a bump body formed on the second conductive pattern.

3. The wiring board according to claim 1, wherein the via conductor has a plurality of bent portions such that the via conductor tapers from the plurality of bent portions at different taper angles between the second conductive pattern and the first conductive pattern, and the plurality of bent portions includes the bent portion.

4. The wiring board according to claim 1, wherein among the plurality of layers forming the second resin insulation layer, a first layer positioned closest to the first conductive pattern has an elastic coefficient which is higher than an elastic coefficient of a second layer positioned closest to the second conductive pattern.

5. The wiring board according to claim 1, wherein among the plurality of layers forming the second resin insulation layer, a first layer positioned closest to the first conductive pattern has a thermal expansion coefficient which is lower than a thermal expansion coefficient of a second layer positioned closest to the second conductive pattern.

6. The wiring board according to claim 4, wherein the elastic coefficient of the first layer is set in a range of 5~10 GPa, and the elastic coefficient of the second layer is set in a range of 0.01~0.1 GPa.

7. The wiring board according to claim 2, wherein the bump body is formed directly on the via conductor.

8. The wiring board according to claim 1, wherein the via conductor is formed by filling a plating material in the opening portion of the second insulation layer.

9. The wiring board according to claim 1, wherein the tapered portion of the side surface of the via conductor is a curved surface.

10. The wiring board according to claim 1, further comprising:
a semiconductor chip having an electrode; and
a via conductor formed in the first resin insulation layer,
wherein the first resin insulation layer is formed on the semiconductor chip, and the via conductor in the first resin insulation layer is electrically connecting the first conductive pattern and the electrode of the semiconductor chip.

11. A method for manufacturing a wiring board, comprising:
forming a first resin insulation layer on a support body;
forming a first conductive pattern on the first resin insulation layer;
forming a second resin insulation layer on the first conductive pattern and the first resin insulation layer;
forming in the second resin insulation layer an opening portion exposing at least a portion of the first conductive pattern such that the opening portion has a side wall extending to the portion of the first conductive pattern and a bent portion where an inclination of the side wall of the opening portion changes in a depth direction of the opening portion;
forming in the opening portion of the second resin insulation layer a via conductor extending to the first conductive pattern such that the via conductor has a side surface extending to the first conductive pattern and a bent portion where an inclination of the side surface of the via conductor changes in a depth direction of the via conductor and that the via conductor tapers from the bent portion toward the first conductive pattern and includes a tapered portion decreasing in size from the bent portion toward the first conductive pattern and a non-tapered portion such that the bent portion forms a boundary between the tapered portion and the non-tapered portion; and forming a second conductive pattern on the second resin insulation layer such that the second conductive pattern is electrically connected to the first conductive pattern via the via conductor, wherein the forming of the second resin insulation layer comprises forming a plurality of layers having different elastic coefficients, and the bent portion of the via conductor is formed in a layer having the lowest elastic coefficient among the plurality of layers forming the second resin insulation layer.

12. The method for manufacturing a wiring board according to claim 11, wherein among the plurality of layers forming the second resin insulation layer, a first layer positioned closest to the first conductive pattern has an elastic coefficient higher than an elastic coefficient of a second layer positioned closest to the second conductive pattern.

13. The method for manufacturing a wiring board according to claim 12, wherein the forming of the opening portion comprises forming the bent portion in the second layer.

14. The method for manufacturing a wiring board according to claim 11, wherein the forming of the bump body comprises forming the bump body directly on the via conductor.

15. The method for manufacturing a wiring board according to claim 11, wherein the forming of the first resin insulation layer comprises forming the first resin insulation layer on a semiconductor element, wherein the semiconductor element is the support body.

16. The method for manufacturing a wiring board according to claim 15, further comprising forming a via conductor in the first resin insulation layer such that the via conductor in the first resin insulation layer is connected to an electrode of the semiconductor element, wherein the forming of the first conductive pattern comprises forming the first conductive pattern such that the first conductive pattern is electrically connected to the electrode of the semiconductor element.

17. The method for manufacturing a wiring board according to claim 15, wherein the forming of the via conductor comprises filling a plating material in the opening portion of the second insulation layer.

* * * * *